United States Patent [19]
Mazura et al.

[11] Patent Number: 5,722,787
[45] Date of Patent: Mar. 3, 1998

[54] ARRANGEMENT FOR CODING THE PLUG-IN SPACE OF A PLUG-IN MODULE IN A MODULE RACK

[75] Inventors: Paul Mazura, Karlsbad; Michael Joist, Gaggenau, both of Germany

[73] Assignee: Schroff GmbH, Straubenhardt, Germany

[21] Appl. No.: 610,953

[22] Filed: Mar. 5, 1996

[30] Foreign Application Priority Data

Mar. 7, 1995 [DE] Germany ......................... 195 07 724.5

[51] Int. Cl.⁶ .................................................. F16B 21/14
[52] U.S. Cl. ........................ 403/405.1; 403/13; 403/24; 174/68.2
[58] Field of Search ................................. 403/24, 405.1, 403/406.1, 407.1, 408.1, 11, 12, 13, 14, 321; 174/68.2, 70 B, 99 B

[56] References Cited

U.S. PATENT DOCUMENTS

| | | | |
|---|---|---|---|
| 3,210,716 | 10/1965 | Meacham | 174/70 B X |
| 4,008,366 | 2/1977 | Geyer | 403/394 X |
| 4,298,771 | 11/1981 | Olashaw | 403/387 X |
| 5,507,585 | 4/1996 | Diederich et al. | 403/13 X |

FOREIGN PATENT DOCUMENTS

| | | |
|---|---|---|
| 0105151 | 7/1987 | European Pat. Off. . |
| 0443492 | 8/1991 | European Pat. Off. . |
| 0579859A1 | 1/1994 | European Pat. Off. . |
| 8607046 U | 6/1986 | Germany . |
| 9205142 U | 7/1992 | Germany . |
| 535498 | 5/1973 | Switzerland . |
| 9117595 | 11/1991 | WIPO ................................. 174/68.2 |

Primary Examiner—Harry C. Kim
Attorney, Agent, or Firm—Spencer & Frank

[57] ABSTRACT

An arrangement for coding a plug-in space of a plug-in module in a module rack by using a layout of at least one coding pin and at least one associated coding hole. The coding hole has at least one holding bracket through which extends a fastening screw, and the module rack has at least one front profiled rail which has a longitudinal groove into which there is inserted a perforated strip having equidistant holes. The holding bracket has a receiver for the coding pin, which receiver has an internal polygon. The coding pin is displaceable within the receiver and has a corresponding external polygon. The coding pin is provided with a longitudinally extending coding rib at its shaft. Also provided is at least one coding plug which has at least one pin for the introduction into a hold of the perforated strip. The coding plug has the coding hole for the coding pin and a through hole for the fastening screw. The coding hold is provided with an edge recess for the coding rib.

12 Claims, 1 Drawing Sheet

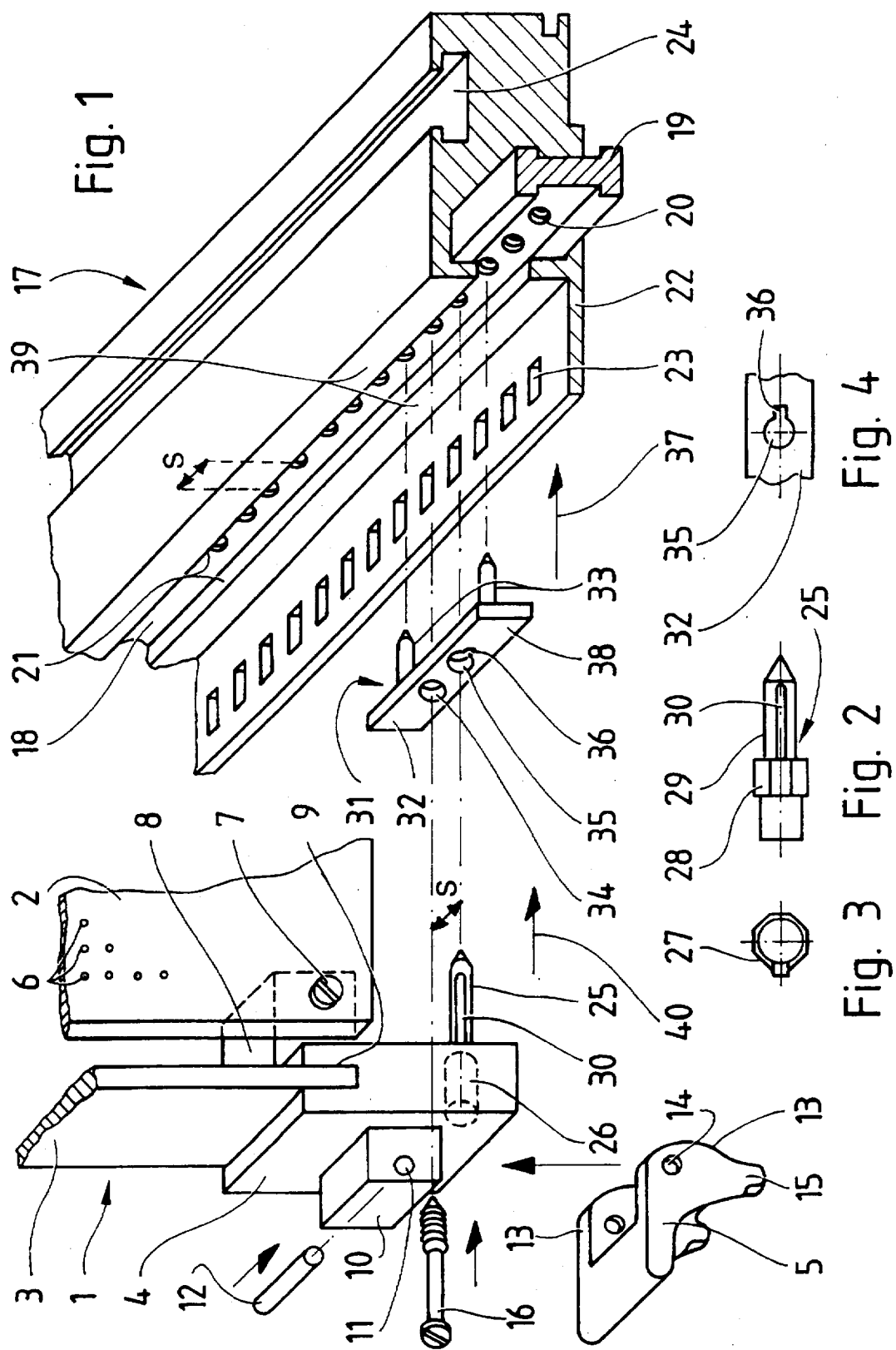

ARRANGEMENT FOR CODING THE PLUG-IN SPACE OF A PLUG-IN MODULE IN A MODULE RACK

CROSS-REFERENCE TO RELATED APPLICATION

This application claims the priority of Patent Application Serial No. P 195 07 724.5 filed in Germany on Mar. 7, 1995, the subject matter of which is incorporated herein by reference.

BACKGROUND OF THE INVENTION

The invention relates to an arrangement for coding the plug-in space of a plug-in module in a module rack by using a layout of at least one coding pin and at least one associated coding hole, with the plug-in module comprising at least one holding bracket through which extends a fastening screw and the module rack being provided with at least one front profiled rail which has a longitudinal groove into which is inserted a perforated strip having equidistant holes.

The invention is applied for the mechanical coding of the plug-in spaces for standardized plug-in modules of any width in module racks which conform to standards.

A great number of coding devices are known. They employ replaceable or variable coding elements which cooperate so as to effectively prevent the insertion of a plug-in module in a space which is not intended for the module. Different coding devices are arranged on or next to the plug connector which electrically connects the plug-in module with other components of the module rack. But these devices necessitate a complicated coding process which can only take place from the rear side of the module rack.

A flat module having a corner mounting body which module is designed to be inserted into a module rack is known; from the rear side of the corner mounting body protrude coding means which, during insertion, form an operative connection with complementary coding means that are provided on the rail system of the module rack (EP 0 579 859 A1).

Furthermore, a module unit for plug-in modules is known at the rear side of which a plug holder with coding elements is provided the coding elements engaging coding pins provided on the rear edge of the associated plug-in module (EP 0 105 151).

Also known is a plug-in module having a holding bracket which connects the printed circuit board with the front plate and which is provided with extracting means. A fastening screw extends through the holding bracket; the inserted module can be screwed to a support rail of the module rack with the aid of the fastening screw. But here, coding means are not provided (DE 86 07 046 U1).

Finally, an arrangement for the coding of plug connections is known, wherein polygonal coding plugs that can be plugged in at different angles can be inserted into coupling elements whose receivers correspond to the plug profile and which can be fixed so that their angles are in agreement with one another (CH 535 498).

All of these known coding devices cannot be used for the coding of plug-in spaces for standardized systems either due to the dimensions of the devices or due to their mounting space requirements.

Other coding arrangements are housed in the region of the front plates of the plug connectors or in the front ends of the guide rails for the plug-in cards. In order to be able to use these coding elements for plug-in modules and module racks conforming to standards, it would not be possible to avoid using mounting locations and spaces for these elements which need to remain open because of the existing standards.

SUMMARY OF THE INVENTION

It is the object of the invention to design an arrangement for the coding of plug-in spaces for standardized plug-in modules and standardized module racks which can be mounted without interfering in their predetermined geometry.

In order to solve this object, a known arrangement is used as a basis for coding the plug-in space of a plug-in module in a module rack by using a layout of at least one coding pin and at least one associated coding hole, with the plug-in module comprising at least one holding bracket through which extends a fastening screw and the module rack being provided with at least one front profiled rail which has a longitudinal groove into which is inserted a perforated strip having equidistant holes.

The present object is solved in that the holding bracket has a receiver for the coding pin, the receiver is provided with an internal polygon, the coding pin is displaceable within the receiver and has a corresponding external polygon, the coding pin is provided with a longitudinally extending coding rib at its shaft, at least one coding plug is provided, the coding plug has at least one pin for the introduction into a hole of the perforated strip, the coding plug is provided with the coding hole for the coding pin and a through hole for the fastening screw, and that the coding hole is provided with an edge recess for the coding rib.

This two-piece coding arrangement, namely comprising the coding pin, which can be replugged and which is provided on the holding bracket, and a small assortment of coding plugs provided with differently configured coding holes, which coding plugs can be inserted between the holding bracket and the profiled rail, does not require any mounting space on the plug-in module nor does it require a separate space on the module rack. The expenditure for the coding elements is minimal, coding as well as recoding can be carried out without problems from the front side of the module rack.

The coding plug does not require any useful space between plug-in card and module rack if it is provided with a plug body having the shape of a low parallelepiped which fits in-to the opening slot of the longitudinal groove of the profiled rail.

In a preferred embodiment, the inserted plug body is flush with the front face of the profiled rail. This configuration results in optimum insertion conditions.

It is possible to also use the through hole in the coding plug for coding purposes, which hole is provided for the fastening screw of the plug-in module, by providing this hole as a coding hole with a corresponding edge recess which correlates with the coding rib of the coding plug. Then, this coding plug can also be-plugged into the perforated strip while being turned by 180°.

A total of eight different codings can be accomplished if the internal polygon of the receiver and the external polygon of the coding pin are embodied as octagons. Together with those coding pins and those coding plugs provided on a second holding bracket of the plug-in module, altogether 64 codings can be produced for a plug-in module.

So as to ensure a perfect fit among the coding elements involved, the coding rib and the associated edge recess are provided with a rectangular cross section.

BRIEF DESCRIPTION OF THE DRAWINGS

These and other features and advantages of the invention will be further understood from the following detailed description of the preferred embodiment with reference to the accompanying drawings; these show:

FIG. 1 a perspective view plug-in module and the front profiled rail of a module rack in a pulled out position in an exploded and simplified representation and on an enlarged scale;

FIG. 2 a side view of a coding pin in a side view, enlarged to about twice the size shown in to FIG. 1;

FIG. 3 a front view of the coding pin according to FIG. 2;

FIG. 4 coding hole mateable with the coding pin of FIGS. 2 and 3.

DETAILED DESCRIPTION OF THE PREFERRED EMBODIMENTS

The plug-in module 1 partially represented in FIG. 1 comprises a plug-in card 2, a front plate 3, a holding bracket 4 and a pivoted lever 5.

The plug-in card 2, which is provided with a matrix of holes 6 for receiving electrical and electronic components, is screwed to a projection 8 of the holding bracket 4 by means of a cap screw 7. The holding bracket 4 has a slot 9 in which the inserted front plate 3 is fastened. A console 10 of the holding bracket 4 is provided with a through bore 11 for receiving a swing pin 12. The pivoted lever 5 having a U-shaped layout has bearing holes 14 in its two wall sections 13 for the swing pin 11. A nose 15 protrudes from each wall section 13. Below the console 10, a fastening screw 16 extends through the body of the holding bracket 4. A second identically configured holding bracket may be provided at the opposite end of the front plate 3.

The front profiled rail 17, which is only partially shown in FIG. 1, is provided with a longitudinal groove 18 into which a perforated strip 19 is inserted. This perforated strip 19 has a row of equidistant holes 20. As is shown in the drawing, the holes 20 are threaded holes, but threaded holes alternating with holes having a different (for example, square) profile may also be present. The front profiled rail 17 is a component of a commercially available plug-in module (not shown) which, for example, has four parallel profiled rails which are connected by two side walls facing one another. The holes 20 are accessible through an opening slot 21 of the longitudinal groove 18.

A formed-on longitudinal strip 22 of the profiled rail 17 has a row of openings provided at identical distances. The noses 15 of the pivoted lever 5 engage respectively two of these openings 23 as the plug-in module 1 is pulled into the module rack or extracted from it. The groove 24 having a T-shaped cross section of the profiled rail 17 serves for the insertion of guide rails (not shown) for the plug-in card 2. In the module rack there is space for a plurality of plug-in modules of identical or different width, with the modules being placed next to one another.

The coding of the plug-in module in the module rack takes place in a mechanical manner. For this purpose, a coding pin 25 is provided in the holding bracket 4 of the plug-in module 1, which coding pin is plugged into a receiver 26 (indicated in dashed lines), for example, in the shape of a blind bore. This receiver 26 defines an internal polygon 27 (FIG. 3) and the coding pin 25 defines a corresponding external polygon 28 which fits into this internal polygon 27 (FIG. 2). Internal polygon 27 and external polygon 28 are embodied as octagons so that the coding pin can take a total of eight different plug-in positions, which results in eight coding possibilities. At its shaft 29 protruding from the holding bracket 4 parallel to the plug-in card 2, the coding pin 25 has a longitudinally extending coding rib 30 which is provided with a rectangular cross section.

A coding plug 31 associated with each of the plug-in spaces to be coded is comprised of a plug body 32 having two plug pins 33, with a through hole 34 and a coding hole 35 disposed between the plug pins.

The coding plug 31 is comprised of, for example, plastic and its plug body 32 has the shape of a low parallelepiped; the plug pins 33 may be formed onto the plug body. The through hole 34 allows the thread of the fastening screw 16 to be guided through, that is, the through hole is slightly larger than the screw's thread diameter. The coding hole 35 disposed next to the through hole receives the coding pin 25 and is therefore provided with an edge recess 36 with a rectangular layout for the coding rib 30. Naturally, the coding pin 25 and the coding hole 35 may also have different (for example, star-shaped) layouts which correspond with one another. If the thread diameter of the fastening screw 16 and the diameter of the shaft 29 of the coding pin 25 are selected so as to be identical in size, the through hole 34 may also be used as a coding hole if it is provided with a corresponding edge recess.

For the coding of a plug-in space in the module rack, the coding plug 31 with its two plug pins 33 is first plugged into two holes 20 (in the present case into two threaded holes) of the coding strip 19 (of the threaded perforated strip) in the direction of arrow 37. When completely inserted, the plug body 32 fits exactly into the opening slot 21 of the longitudinal groove 18 and the back 38 of the plug is flush with the (two-piece) front face 39 of the profiled rail 17.

Then, the plug-in module 1 is pushed, with the plug-in card 2 forward, in the direction of arrow 40 into the plug-in space prepared by the inserted coding plug 31 after the coding pin 25 has been plugged into its receiver 26 in such a manner that its coding rib 30 is in alignment with the position of the edge recess 36 of the coding hole 35 of the coding plug 31.

Finally, the fastening screw 16 is guided through a screw hole in the body of the holding bracket 4 which is provided for this purpose. This screw hole is disposed opposite of and in alignment with the through hole 34 of the coding plug 31 and also a hole 20 of the perforated strip 19. The pivoted lever 5 serves to facilitate the insertion as soon as its two noses 15 have engaged two of the openings 23 of the longitudinal strip 22. The plug-in module 1 is screwed to the profiled rail 17 with the screwed-on fastening screw 16.

The spacing S in-between the holes 20 is standardized. On the holding bracket 4, the coding pin 25 has the same distance S from the fastening screw 16 and, on the coding plug 31, the through hole 34 has the same distance S from the coding hole 35. The two pins 33 of the coding plug 31, in turn, have the same lateral distance S with respect to either the through hole 34 or the coding hole 35.

At both ends of its front plates 3, each plug-in module 1 is provided with one holding bracket each; these two holding brackets are configured so as to be identical. If both holding brackets are provided with one coding pin each and if a coding plug is also inserted into the upper front profiled rail, this results in a total of 64 plug-in spaces.

It will be understood that the above description of the present invention is susceptible to various modifications, changes and adaptations, and the same are intended to be comprehended within the meaning and range of equivalents of the appended claims.

What is claimed is:

1. An arrangement for coding a plug-in space of a plug-in module in a module rack by using a layout of at least one coding pin and at least one associated coding hole, said plug-in module comprising at least one holding bracket through which extends a fastening screw, and said module rack having at least one front profiled rail which has a longitudinal groove into which is inserted a perforated strip having equidistant holes, said holding bracket having a receiver for the coding pin, said receiver having an internal polygon, the coding pin being displaceable within said receiver and having a corresponding external polygon, said coding pin being provided with a longitudinally extending coding rib at its shaft, there being at least one coding plug having at least one pin for the introduction into a hole of the perforated strip, said coding plug having said coding hole for the coding pin and a through hole for said fastening screw, and said coding hole being provided with an edge recess for said coding rib.

2. An arrangement according to claim 1, wherein the longitudinal groove of the profiled rail defines an opening slot and said coding plug has a plug body having the shape of a low parallelepiped and being insertable into the opening slot.

3. An arrangement according to claim 2, wherein said plug body, when inserted into the opening slot, is flush with a front face of the profiled rail.

4. An arrangement according to claim 1, wherein the through hole in said coding plug further has an edge recess thereby serving as another coding hole.

5. An arrangement according to claim 1, wherein said internal polygon of said receiver and said external polygon of said coding pin are octagons.

6. An arrangement according to claim 1, wherein said coding rib and said edge recess have a rectangular cross section.

7. A coding arrangement comprising: a coding pin including:
　a shaft;
　a pin portion disposed about the shaft and defining a polygonal cross section in a plane perpendicular to a longitudinal axis of the coding pin; and
　a longitudinally extending coding rib disposed on the shaft;

a plug-in module including:
　a holding bracket defining a receiver adapted to receive the coding pin therein and having a receiver portion defining a polygonal cross section in a plane perpendicular to a longitudinal axis of the receiver such that the receiver portion is adapted to matingly receive the pin portion therein; and
　a fastening screw extending through the holding bracket; a module rack including:
　a front profiled rail defining a longitudinal groove therein;
　a perforated strip inserted into the longitudinal groove and defining equidistant holes therein; and a coding plug including a pin adapted to be introduced into a hole of the perforated strip, the coding plug further defining therein:
　a coding hole for receiving the coding pin, the coding hole having an edge recess adapted to matingly receive the coding rib of the coding pin therein; and
　a through hole for receiving the fastening screw therein.

8. The arrangement according to claim 7, wherein:
the longitudinal groove defines an opening slot therein; and
the coding plug includes a parallelepiped shaped plug body insertable into the opening slot.

9. The arrangement according to claim 8, wherein the plug body is flush with a front face of the profiled rail when it is inserted into the opening slot.

10. The arrangement according to claim 7, wherein: the through hole in the coding plug further has an edge recess thereby serving as another coding hole.

11. The arrangement according to claim 7, wherein the cross section of each of the pin portion and the receiver portion in a plane perpendicular to a longitudinal axis thereof is octagonal.

12. The arrangement according to claim 7, wherein each of the coding rib and the edge recess define a rectangular cross section in a plane perpendicular to a longitudinal axis thereof.

* * * * *